(12) United States Patent
Lutley

(10) Patent No.: US 6,535,445 B1
(45) Date of Patent: Mar. 18, 2003

(54) METHOD OF CONTROLLING A MEMORY CELL REFRESH CIRCUIT USING CHARGE SHARING

(75) Inventor: James W. Lutley, Southampton (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/753,695

(22) Filed: Jan. 3, 2001

(51) Int. Cl.[7] ................................................. G11C 7/00

(52) U.S. Cl. ............... 365/222; 365/230.03; 365/189.01

(58) Field of Search ........................... 365/222, 230.03, 365/230.06, 185.11, 185.13

(56) References Cited

U.S. PATENT DOCUMENTS

| | | | | |
|---|---|---|---|---|
| 5,732,040 A | * | 3/1998 | Yabe | 365/230.03 |
| 6,137,742 A | * | 10/2000 | Jung | 365/222 |
| 6,233,195 B1 | * | 5/2001 | Yamazaki | 365/230.03 |
| 6,285,616 B1 | * | 9/2001 | Ikabata | 365/222 |
| 6,343,042 B1 | * | 1/2002 | Tsern et al. | 365/222 |

* cited by examiner

*Primary Examiner*—David Nelms
*Assistant Examiner*—Connie C. Yoha
(74) *Attorney, Agent, or Firm*—Christopher P. Maiorana, P.C.

(57) ABSTRACT

An apparatus configured to generate a signal used to refresh a memory cell in response to (i) a write signal, (ii) a global wordline signal, (iii) a block select signal, and (iv) one or more supply voltages.

20 Claims, 4 Drawing Sheets

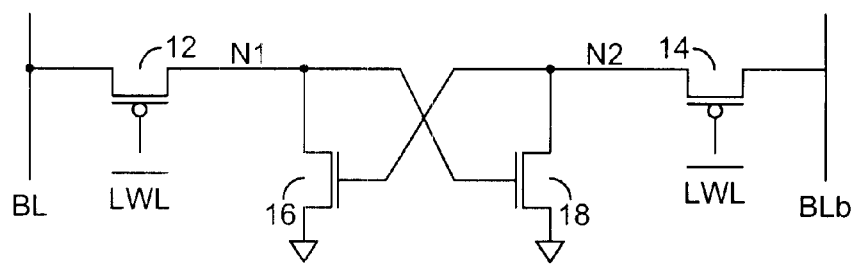
(CONVENTIONAL)
FIG. 1
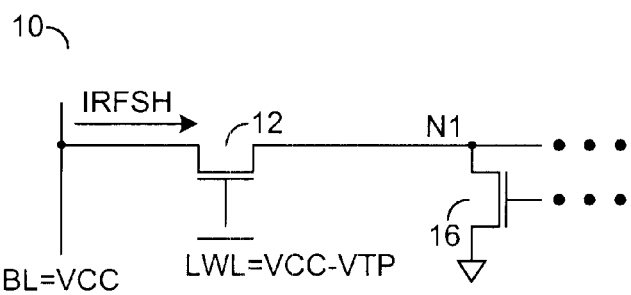
(CONVENTIONAL)
FIG. 2
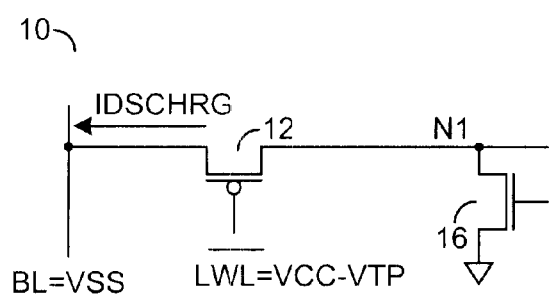
(CONVENTIONAL)
FIG. 3

US 6,535,445 B1

METHOD OF CONTROLLING A MEMORY CELL REFRESH CIRCUIT USING CHARGE SHARING

FIELD OF THE INVENTION

The present invention relates to a method and/or architecture for memory cell refresh generally and, more particularly, to a method and/or architecture for controlling a memory cell refresh circuit using charge sharing.

BACKGROUND OF THE INVENTION

Referring to FIG. 1, a conventional four transistor (4T) loadless SRAM cell 10 is shown. The cell 10 generally comprises a transistor 12, a transistor 14, a transistor 16 and a transistor 18. A node N1 is connected between the drain of the transistor 12 and the gate of the transistor 18. A node N2 is connected between the source of the transistor 14 and the gate of the transistor 16. A first bitline BL is connected to the source of the transistor 12. A second bitline BLB is connected to the drain of the transistor 14. Since there are no internal pull-up transistors, if the node N1 or the node N2 is pulled high, the charge will gradually leak away over time. As a result, a refresh is needed.

To achieve the refresh, the local word line bar (LWLB) is pulled down from the supply voltage VCC to the supply voltage VCC−Vtp, where Vtp is a PMOS threshold voltage. This partially turns on the PMOS pass gates in the memory cell. If the bitlines BL and BLB are at the supply voltage VCC when the local wordline bar LWLB is pulled to VCC−Vtp, the high node in the cell is refreshed.

Referring to FIG. 2, a diagram of the circuit 10 illustrating a conventional refresh operation is shown. The pass gate 12 is partially ON, allowing current to pass and refresh the internal node N1. However, during a write operation, one of the bitlines BL and BLB is pulled to ground. Pulling one of the bitlines BL and BLB to ground could destroy the data in a cell 10 that is being refreshed on the same column as the cell being written to.

Referring to FIG. 3, a diagram of the circuit 10 illustrating conventional data destruction is shown. The pass gate 12 is partially ON, allowing current to discharge the high internal node N1, destroying data.

It is generally desirable to provide a method to switch the refresh off during a write. In order to maximize the time the cell is being refreshed, the refresh circuit should be reactivated as quickly as possible.

SUMMARY OF THE INVENTION

One aspect of the present invention concerns an apparatus configured to generate a signal used to refresh a memory cell in response to (i) a write signal, (ii) a global wordline signal, (iii) a block select signal, and (iv) one or more supply voltages.

Another aspect of the present invention concerns a method for controlling a refresh operation of a memory cell comprising the steps of (A) detecting when a first cell in a block is being written to and (B) turning off a second cell that is being refreshed when the first cell is written to.

The objects, features and advantages of the present invention include providing a method and/or architecture for controlling a refresh operation of a memory cell that may (i) control a refresh operation of a memory cell, (ii) be turned hard off when another cell in the same block is written to, preventing data corruption, and/or (iii) use charge sharing to quickly re-enter refresh mode on completion of a write.

BRIEF DESCRIPTION OF THE DRAWINGS

These and other objects, features and advantages of the present invention will be apparent from the following detailed description and the appended claims and drawings in which:

FIG. 1 is a schematic of a conventional 4T loadless SRAM cell;

FIG. 2 is a schematic of the cell of FIG. 1 illustrating conventional refresh circuit;

FIG. 3 is a schematic of the cell of FIG. 1 illustrating data destruction;

DETAILED DESCRIPTION OF THE PREFERRED EMBODIMENTS

Figure 4:
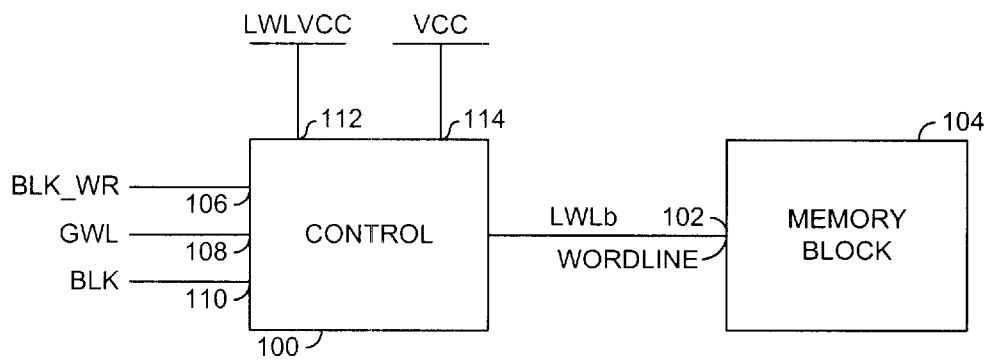
FIG. 4 is a block diagram of a preferred embodiment of the present invention.

Referring to FIG. 4, a block diagram of a circuit 100 is shown in accordance with a preferred embodiment of the present invention. The circuit 100 may be implemented as a local wordline circuit. The circuit 100 may present a signal (e.g., LWLB). The signal LWLB may be a local wordline signal. The circuit 100 may have an input 106 that may receive a signal (e.g., BLK_WR), an input 108 that may receive a signal (e.g., GWL), an input 110 that may receive a signal (e.g., BLK), an input 112 that may receive a signal (e.g., LWLVCC) and an input 114 that may receive a signal (e.g., VCC). The signal BLK may be a block select signal. The signal GWL may be a global wordline signal. The signal BLK_WR may be a block write signal. The signal LWLVCC may be a local wordline supply voltage. The signal VCC may be a supply voltage. A memory block (or circuit) 104 may be implemented, in one example, as a number of 4T SRAM cells. However, other cells may be implemented accordingly to meet the design criteria of a particular implementation. The circuit 104 may have an input 102 that may receive the signal LWLB.

The circuit 100 may be used to switch the refresh off during a write. In order to maximize the time the cells within the memory block 104 are being refreshed, the refresh circuit 100 must be reactivated as quickly as possible. The circuit 100 may be used to control a refresh operation of a 4T loadless SRAM cell using charge sharing to ensure fast response times. A 4T loadless SRAM memory cell requires the cell to be refreshed in order to maintain data in the cell.

When implementing a memory using 4T loadless SRAM memory cells, such as the cells of the memory bock 104, a refresh is normally required in order to maintain the data, since 4T cells do not have internal pull-up transistors. To achieve the refresh, the pass gates in the cell are partially turned on and the high node in the cell is refreshed from the bitlines BL and BLB.

However, during a write, one of the bitlines BL or BLB is pulled to ground. If the cell being refreshed has the opposite data as the cell with the write, the data in the cell being refreshed will be destroyed. Therefore, the refresh needs to be turned off during a write.

Figure 5:
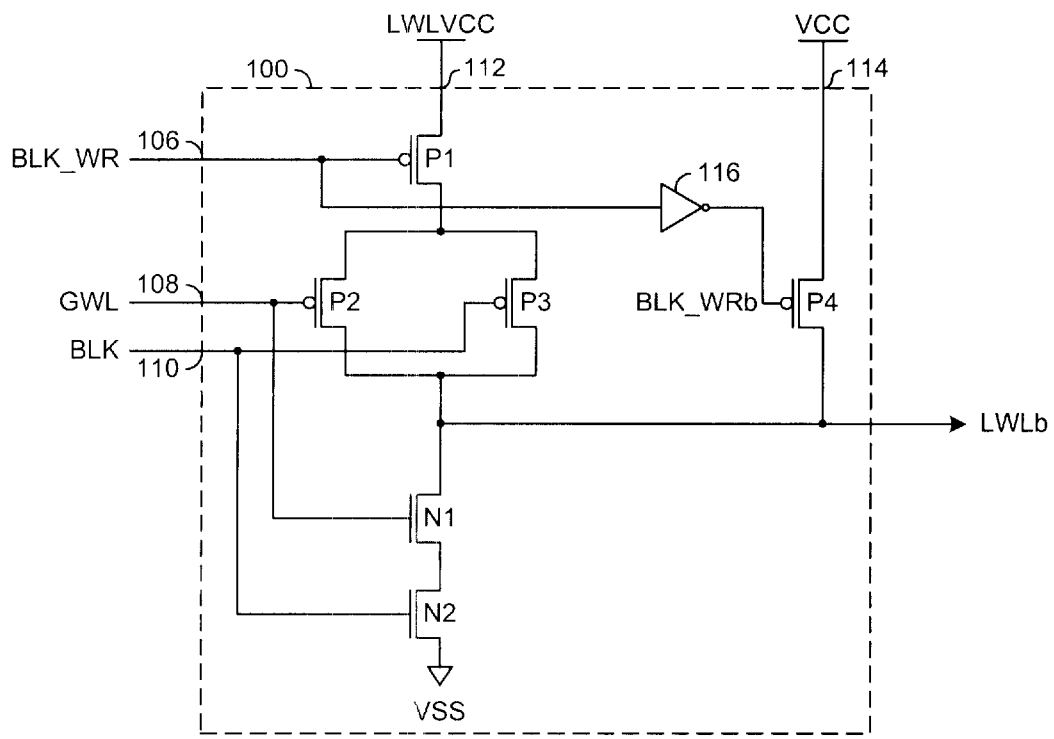
FIG. 5 is a schematic of a local wordline driver associated with the present invention.

Referring to FIG. 5, a more detailed diagram of the circuit 100 is shown. The circuit 100 generally comprises a transistor P1, a transistor P2, a transistor P3, a transistor P4, a transistor N1, a transistor N2. The transistors P1–P4 may be implemented as PMOS transistors. The transistors N1 and N2 may be implemented as NMOS transistors. However, other transistor types may be implemented accordingly to meet the design criteria of a particular implementation.

The signal BLK_WR may be presented to the gate of the transistor P1 as well as to the gate of the transistor P4 (through an inverter 116). The signal GWL may be presented to the gate of sax the transistor P2 as well as to the gate of the transistor N1. The signal BLK may be presented to the gate of the transistor P3 as well as to the gate of the transistor N2. The signal LWLVCC may be presented to a source of the transistor P1. The signal VCC may be presented to a source of the transistor P4. The signal LWLB may be presented at a node formed by the connection of drains of the transistors P2, P3 and P4 and a source of the transistor N1. The transistor N2 may have a drain that may be connected to a supply ground (e.g., VSS). A drain of the transistor P1 may be connected to the sources of the transistors P2 and P3. A drain of the transistor N1 may be connected to a source of the transistor N2. The transistor P4 is generally sized to minimize crowbar current (e.g., when the signals BLK_WRb, GWL and BLK are all on). The transistor P4 may be smaller than the transistors P1, P2 or P3, since the transistor P4 may only have to drive VCC–Vtp to VCC.

Figure 6:
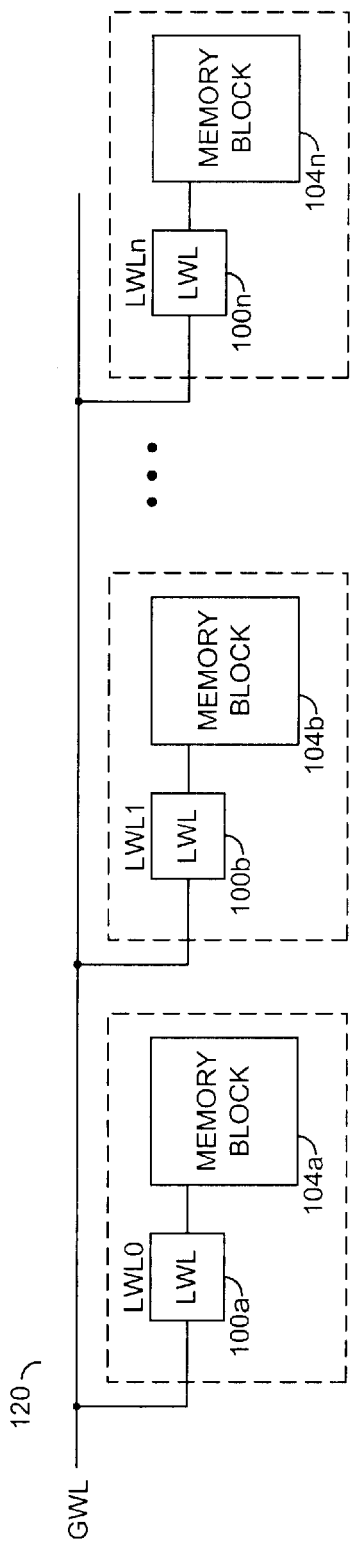
FIG. 6 is a block diagram of a global wordline having several memory blocks and associated local wordline drivers.

Referring to FIG. 6, a circuit 120 is shown implementing one local wordline drive 100a–100n per memory block 104a–104n. The global wordline GWL has N local wordline LWLB drivers, where N is an integer. The global wordline GWL may be split into several blocks of local wordlines in order to improve speed and power consumption.

Figure 7:
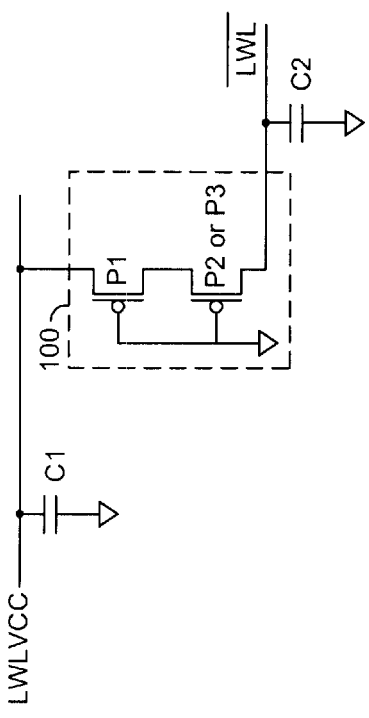
FIG. 7 is a schematic of a capacitance circuit associated with the present invention.

Referring to FIG. 7, a capacitance effect of the circuit 100 during a refresh operation (described below in the context of FIG. 8a) is shown. The circuit 100 may convert the supply voltage VCC to the wordline LWLVCC. The wordline LWLVCC has a very large capacitance (e.g., C1) to supply ground. The capacitance C1 is the capacitance of all the other local wordlines LWL on the global wordline GWL and the local wordline supply LWLVCC.

The local wordline LWLB at the supply voltage VCC only has the capacitance to supply ground C2 of one local wordline LWL worth of memory cells. As the capacitance C1 is much greater than the capacitance C2, the local wordline LWLB is at the supply voltage VCC and will be pulled down to VCC–Vtp very quickly and the cells will begin to refresh.

Figure 8A:
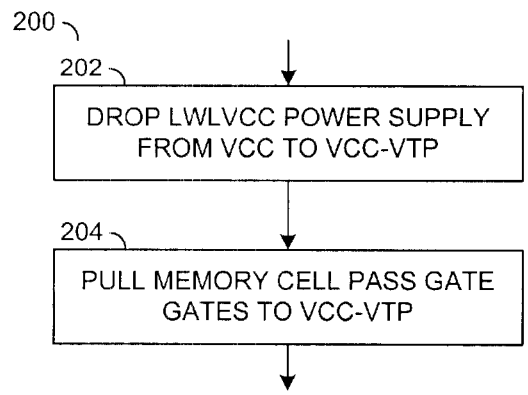
FIGS. 8(a–b) are diagrams illustrating an operation of the present invention.

Referring to FIG. 8a, a diagram 200 illustrating a refresh operation of the present invention is shown. When a row of cells is being refreshed, the power supply LWLVCC for all the LWL drivers 100 on a row is dropped from VCC to VCC–Vtp (e.g., block 202). The gates of all the PMOS pass gates in the memory cells on that row are then pulled to VCC–Vtp and a refresh is initiated on that row (e.g., block 204).

Figure 8B:
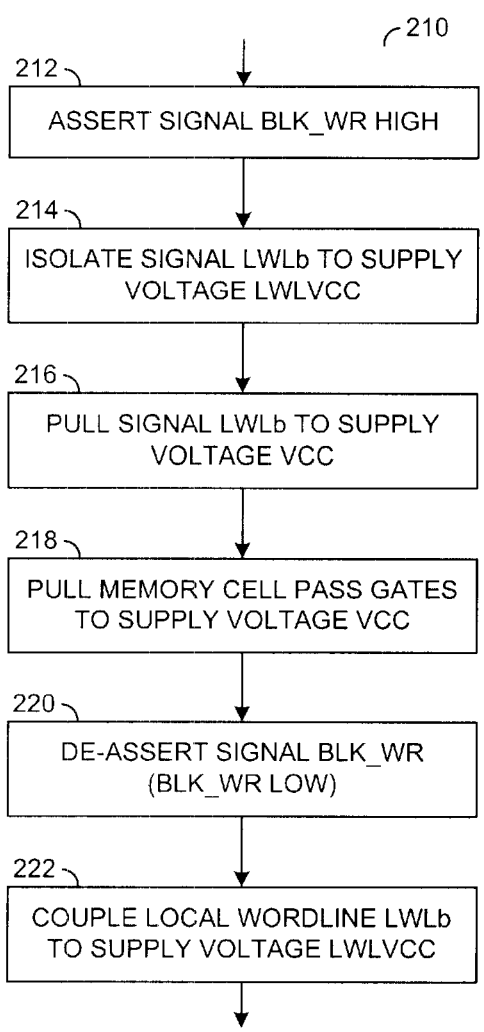

Referring to FIG. 8b, a diagram 210 illustrating a write operation of the present invention is shown. When a write occurs on a block of cells, the signal BLK_WR goes high (e.g., block 212). This turns off the transistor P1, isolating the signal LWLB from the supply voltage LWLVCC (e.g., block 214). The transistor P4 turns on and pulls the signal LWLB to the supply voltage VCC (e.g., block 216). All the gates of the memory cell pass gates in the block of cells are pulled to the supply voltage VCC (e.g., block 218), stopping the refresh and preventing the write operation from destroying data in the cells.

Only the memory block 104 being written to is turned off. The local wordlines LWL in the other memory blocks are still being refreshed. Once the write cycle has finished, the signal BLK_WR goes low and the signal BLK_WRB goes high (e.g., block 220). The transistor P4 is turned off and the transistor P1 turned on, connecting the local wordline LWLB to the local wordline supply voltage LWLVCC (e.g., block 222).

The local wordline supply voltage LWLVCC is saturated at VCC–Vtp, while the local wordline LWLB is saturated at the supply voltage VCC. The local wordline LWLB and the local wordline supply LWLVCL are connected through the transistor P1 and the transistors P2/P3. Since the local wordline supply voltage LWLVCC and the node LWLB are at different voltages, charge sharing will occur between the capacitances C1 and C2 to provide equalization.

The present invention may provide a method and/or architecture for controlling a refresh operation of a memory cell. The cell being refreshed is turned hard off when another cell in the same block is written to, which generally prevents data corruption. On completion of a write, charge sharing is used to re-enter refresh mode quickly after a write operation is finished.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus configured to generate an output signal used to control the refresh of a first memory cell in response to (i) a write signal, (ii) a global wordline signal, (iii) a block select signal, and (iv) one or more supply voltages, wherein access to said first memory cell is disabled in response to said output signal when a second memory cell is written to in a block containing said first memory cell and said second memory cell.

2. The apparatus according to claim 1, wherein said output signal is a wordline signal.

3. The apparatus according to claim 2, wherein said output signal is a local wordline signal.

4. The apparatus according to claim 1, wherein said output signal is presented to a plurality of said memory cells configured as blocks in a memory array.

5. The apparatus according to claim 1, wherein said apparatus comprises a wordline control circuit.

6. The apparatus according to claim 1, wherein said apparatus is configured to de-assert said output signal in response to said write signal.

7. The apparatus according to claim 1, wherein said apparatus is configured to couple the capacitance of one of said global wordline signal and a first of said one or more supply voltages to the capacitance of said output signal in response to said write signal, said global wordline signal, and said block select signal.

8. The apparatus according to claim 1, wherein said first of said supply voltages comprises a local wordline supply voltage.

9. The apparatus according to claim 5, wherein said apparatus is implemented on each wordline of said memory array.

10. A method for controlling a refresh operation of a memory cell comprising the steps of:
   (A) detecting when a first cell in a block is being written to; and
   (B) turning off a second cell that is being refreshed when the first cell is written to in a memory block containing said first cell and said second cell.

11. The method according to claim 10, wherein step (B) prevents data corruption.

12. The method according to claim 10, wherein on completion of a write, charge sharing is used to re-enter said refresh mode after a write operation is finished.

13. The method according to claim 12, wherein said memory cell comprises one or more 4T SPAM memory cells of a memory array.

14. The method according to claim 13, wherein said memory array comprises one or more local wordlines configured to receive a refresh signal during said refresh operation.

15. The method according to claim 14, wherein said method further comprises the step of:
   (C) coupling a capacitance of a global wordline at a first supply voltage to a capacitance of one of said local wordlines at a second supply voltage.

16. The method according to claim 15, wherein step B further comprises the sub-steps of:
   (B-1) isolating said local wordline from said first supply voltage;
   (B-2) pulling said local wordline to said second supply voltage; and
   (B-3) pulling one or more pass gates of said memory cell to said second supply voltage.

17. The method according to claim 15, wherein said first supply voltage is a local wordline supply voltage and said second supply voltage is a circuit supply voltage.

18. An apparatus for refreshing a memory cell comprising:
   means for detecting when a first cell is being written to; and
   means for turning off said refreshing to a second cell when said first cell is being written to in a memory block containing said first cell and said second cell.

19. The apparatus according to claim 18, wherein said apparatus further comprises:
   means for coupling a capacitance of a global wordline of said block at a first supply voltage to a capacitance of a local wordline at a second supply voltage.

20. The apparatus according to claim 1, wherein said refresh comprises refreshing a 4-T SRAM cell.

* * * * *